United States Patent [19]
Baker

[11] 4,456,783
[45] Jun. 26, 1984

[54] MULTIELEMENT OPTICAL PANEL

[75] Inventor: James G. Baker, Bedford, N.H.

[73] Assignee: Polaroid Corporation, Cambridge, Mass.

[21] Appl. No.: 444,059

[22] Filed: Nov. 23, 1982

[51] Int. Cl.³ .................. H01L 31/04; F24J 3/02; G02B 3/00
[52] U.S. Cl. .................. 136/246; 126/424; 126/440; 136/259; 350/167; 350/443; 350/451
[58] Field of Search .............. 136/246, 259; 126/424, 126/440; 350/167, 451, 443

[56] References Cited

U.S. PATENT DOCUMENTS

| | | | |
|---|---|---|---|
| 3,018,313 | 1/1962 | Gattone | 136/246 |
| 3,447,638 | 6/1969 | Kaufer et al. | 354/229 |
| 3,881,810 | 5/1975 | Colao | 350/285 |
| 4,111,695 | 9/1978 | Yevick | 96/40 |

*Primary Examiner*—Aaron Weisstuch
*Attorney, Agent, or Firm*—Francis J. Caufield

[57] ABSTRACT

A thin optical panel formed of two, preferably identical, but opposed spaced apart lenticulated plates structured to form a series of regularly spaced apart line images of the sun, one line image for each associated pair of lenticular elements in a plate. All of the line images formed move short distances as a group across a plane behind the panel during the diurnal motion of the sun. The images thus formed can be tracked with an array of thin silicon ribbons or the like to convert solar energy to electrical energy. Two spaced apart panels arranged to move in their own planes relative to one another continuously collimate solar energy emerging from the second panel which thereafter can be focused onto a single silicon ribbon. With the optical axes of the lenticules of the second panel selectively offset with respect to those of the first panel, focusing onto a single silicon ribbon is achieved by the panels themselves.

37 Claims, 9 Drawing Figures

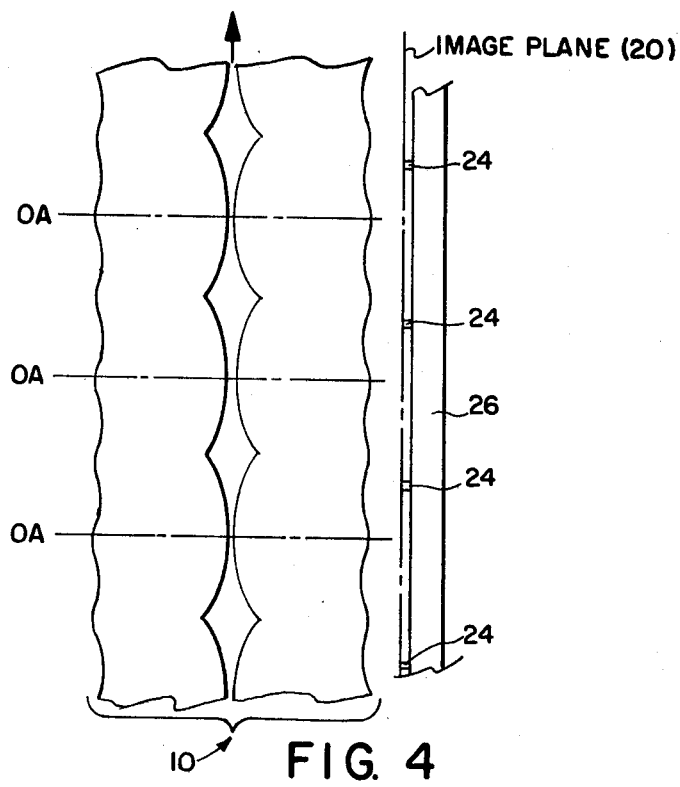
FIG. 4
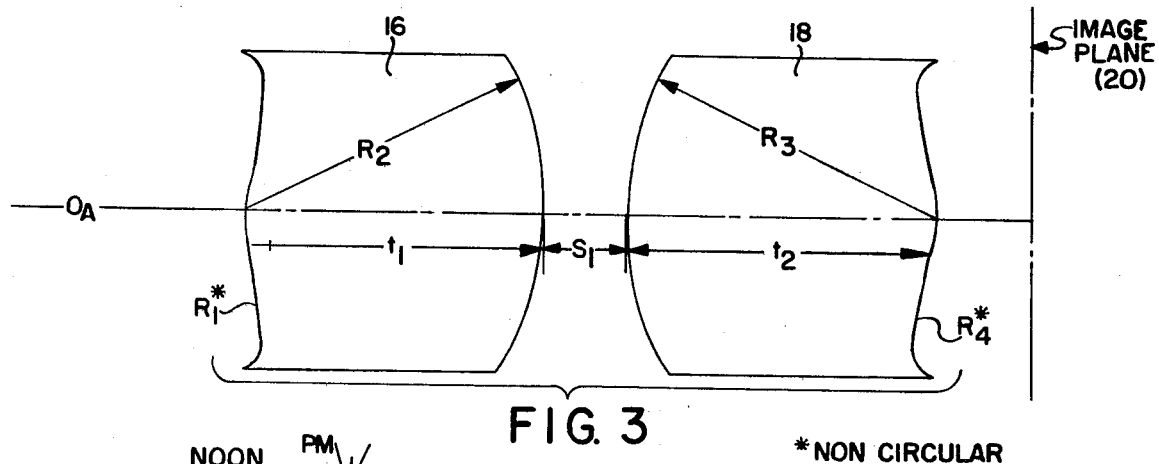
FIG. 3    *NON CIRCULAR
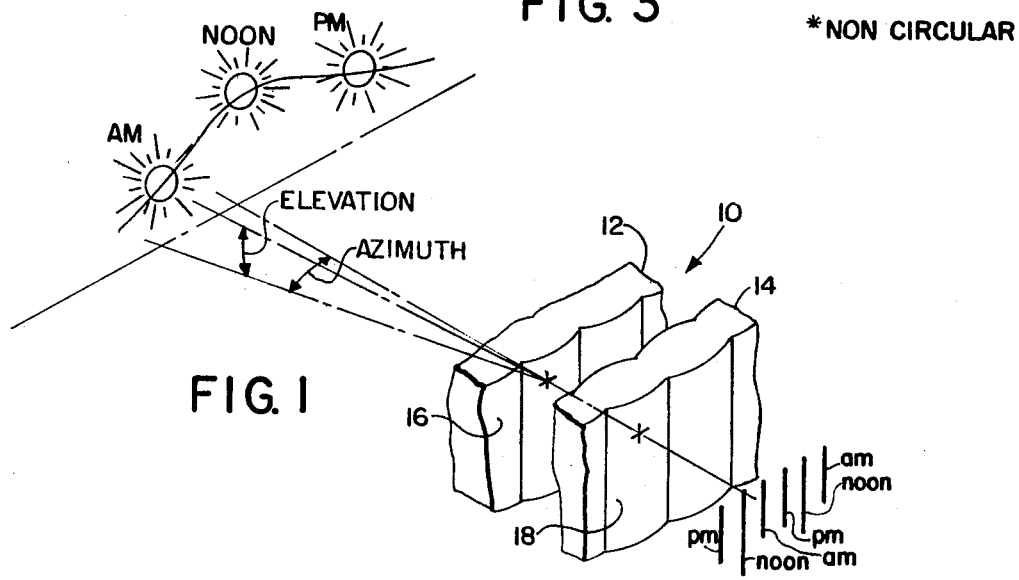
FIG. 1

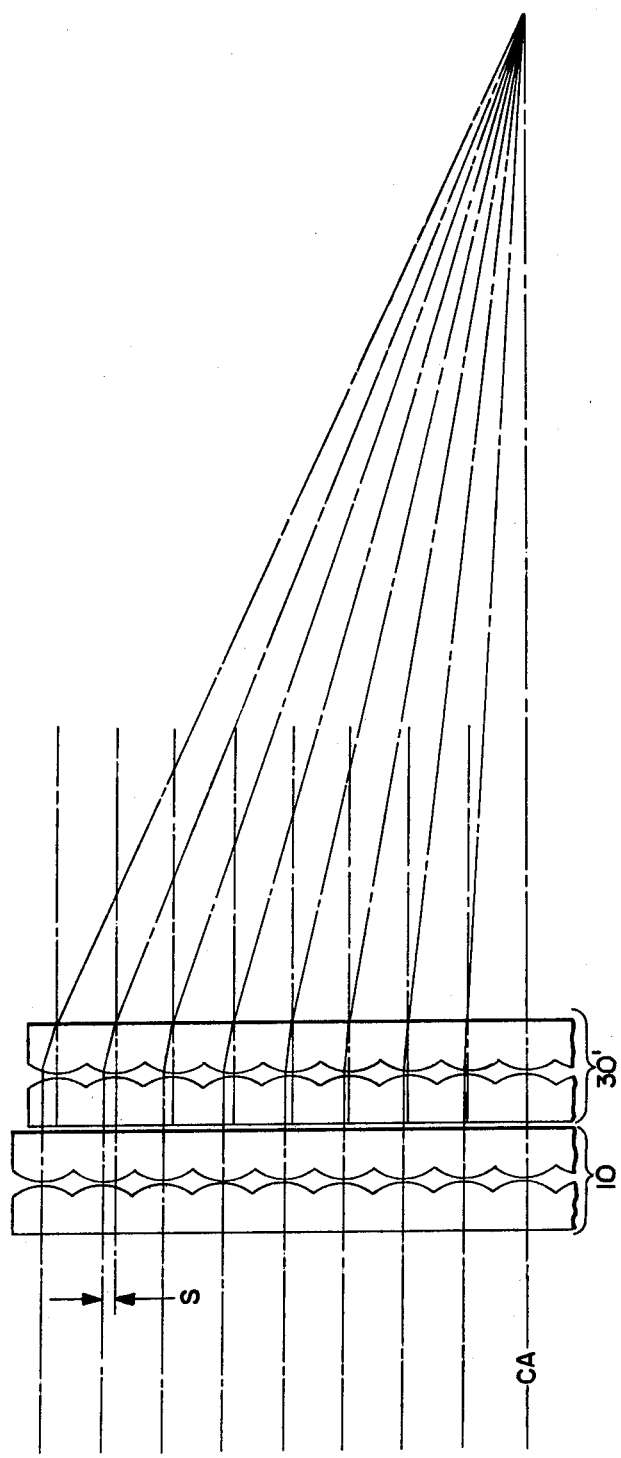

MULTIELEMENT OPTICAL PANEL

FIELD OF THE INVENTION

This invention in general relates to solar energy collection and in particular to optical systems for concentrating the energy of sunlight throughout much of the day onto photovoltaic ribbons intended for converting sunlight into a potential difference, providing a flow of electricity in circuitry.

BACKGROUND OF THE INVENTION

The use of solar cells for powering instrumentation aboard earth-orbiting spacecraft is well known and an established practice and has been extended to power long-range spacecraft even to the outer planets. However, the cost of solar cells per watt of sustained output is very great and completely noncompetitive in the earthbound environment, at least to date. The minimum cost per watt of sustained power under current technology is of the order of $15 per watt, and while improved techniques and manufacturing are being exploited, with the ongoing inflation the cost per watt is, if anything, likely to rise further. One can suppose that there will be breakthroughs in the ultimate techniques of reduced cost in production of silicon collectors, including improvements in the quantum efficiency of silicon-coated substrates, but until these are established, it is worthwhile to explore what might be done to concentrate sunlight in advance onto silicon collectors of reduced area.

In the existing art, Fresnel plastic leans sheets are being successfully used and indeed produce probably the best gain to date in overall economy, as compared, say, to reflective concentrators in the form of cylindrical troughs of generally parabolic cross section. Indeed, the use of such parabolic cylinders comes from the older art introduced toward the turn of the last century by Dr. Charles G. Abbott, director for many decades of the Smithsonian Astrophysical Observatory. Abbott made use of a parabolic cylindrical trough for focusing sunlight onto a central straight pipe lying along the focal line. The pipe was part of a plumbing circuit that conveyed hot oil into a heat exchange arrangement. While a parabolic cylinder is remarkably simple for its purpose and does indeed produce an adequately focused image of the sun onto a focal line, the cylinder nevertheless must be mounted and driven in either one or two axes to track the sun throughout the day and seasons. If the focal line of the cylinder is mounted parallel to the axis of the earth, then one-dimensional tracking is sufficient for following the sun from dawn to dusk and throughout the year.

An entire array of cylindrical parabolic troughs can be set up in a flat area, such as a field or roof, or even on a sloping roof, and driven to track either in the above-described single mode, or just as easily with modern electronic controls in two coordinates—the only additional requirement being that the strip image of the sun lie along the focal line. There are certain practical difficulties, however, having to do with rain, wind, ice and snow, and with dust and corrosion of the reflectors. Of these, perhaps wind is the worst offender in that countermeasures lead to high cost and elaborate arrays. For power purposes these costs are barely competitive but numerous arrays have been and are being built here and abroad.

A competing means has been devised to minimize the extensive plumbing requirements of an array of troughs. Here, thousands of flat or perhaps slightly curved mirrors are arrayed to focus sunlight onto a single collector, which necessarily is exposed to intense heat. The energy focused onto the collector is removed at a sufficient rate so that the collector is maintained below a damaging temperature. This kind of array is under development for power purposes and indeed has been long used by the French in an impressive installation in southern France in the Pyrenees. This kind of array is almost too intense for use with solar cells and is better suited to indirect means for power generation such as the use of super-heated steam to drive turbines. There also are the devices that simply make use of the so-called greenhouse effect to cause the temperature to rise within a tube or set of concentric tubes. The tubes contain some fluid for heat transport to a central station. There has also been proposed to make use of the same intensely active molten mixture of sodium and magnesium that is used in heat transport aboard nuclear submarines. Such tubes are usually mounted along the focal lines of reflective or Fresnel concentrators and are not principally used for photovoltaic conversion.

Returning therefore to to use of Fresnel plastic lens sheets, it is to be noted that this method is cost effective and already within the state of the art. Nevertheless, tracking in one or two degrees of freedom is still involved, and may lead to costly mounting problems to counteract the distructive effects of wind, snow and ice. Arrays of Fresnel concentrators can be mounted in polar form to track the sun throughout the day onto silicon converters mounted along focal lines, or can be mounted in gimbals to track the sun in two degrees of freedom throughout the day. One may note that only one precision tracker to follow the sun is needed, if all the other elements of the array, however large, are slaved to the precision tracker, either through gearing, belt drives or preferably by electronic controls. If the Fresnel sheets are large, they must be adequately mounted and protected from wind damage. If they are small, one is faced with having numerous mechanical or electrical drives in one or two coordinates, which of themselves must be sturdy enough to withstand all sources of degradation.

As will be seen in the detailed description which follows, the type of solar tracker and concentrator being considered here is probably most closely related to the Fresnel system but is in the form of flat panels that can be flat mounted and arranged in large arrays, whether on a field, or on a flat or sloping roof, or used as windows or skylights, or even as canopies over fields. While the threat of wind damage is always present, well anchored, flat-streamlined panels, and sets of panels provide no individual edges that will allow the wind to work its will ultimately on the array. Indeed, protective fencing around a field of flat panels can be used to calm ambient wind conditions to harmless breezes.

One object of this invention, therefore, is to provide for solar tracking in the form of panels which move only slightly in their own planes for tracking the sun throughout the day.

Another object of this invention is to miniaturize the lateral motion required of a solar tracking panel to allow almost imperceptible rates and amplitudes so as to confine the range of movement of individual panes or lights of the panels so that they may be mounted within simple framing, as for ordinary window frames, without having the appearance or reappearance of exposed edges open to view or that would collect dirt, snow and ice and interact with the wind.

Other objects of the invention will in part be obvious and will in part appear hereinafter. The invention, accordingly comprises the apparatus possessing the construction, combination of elements, and arrangement of parts exemplified in the following detailed disclosure.

SUMMARY OF THE INVENTION

This invention in general relates to solar energy collection and in particular to optical systems for concentrating the energy of sunlight throughout much of the day onto photovoltaic ribbons intended for converting sunlight into electrical energy.

The optical system of the invention comprises a thin optical panel formed of two, preferably identical, but opposed spaced apart lenticulated plates structured to form a series of regularly spaced apart line images of the sun, one line image for each associated pair of lenticular elements in a plate. All of the line images formed by a panel move short distances as a group across a plane behind the panel during the diurnal motion of the sun. The images thus formed can be tracked with an array of thin spaced apart silicon ribbons or the like to convert solar energy to electrical energy, and because of the structure of the panels, the motion required for tracking is extremely small, on the order of the width of a lenticular element.

Two spaced apart panels arranged to move in their own planes relative to one another operate to continuously collimate solar energy emerging from the second panel which can thereafter be focused onto a single silicon ribbon. An embodiment of this use of the invention is described where a Fresnel lens is combined with a panel pair to focus on a single, preferably silicon, strip.

Selective offsets introduced between the respective optical axes of individual pairs of lenticular elements in two panels are shown demonstrating that such panels so structured can be used themselves to focus onto a silicon ribbon.

Specific examples in the form of optical constructional data are given for panel construction in different materials.

DESCRIPTION OF THE DRAWINGS

The novel features that are considered characteristic of the invention are set forth with particularity in the appended claims. The invention itself, however, both as to its organization and method of operation together with other objects and advantages thereof will be best understood from the following description of the illustrated embodiments when read in connection with the accompanying drawings wherein like numbers have been employed in the different figures to denote the same parts wherein:

FIG. 1 is a diagrammatic perspective view showing in greatly enlarged fashion part of an optical panel of the invention and solar strip images it forms during the diurnal motion of the sun;

FIG. 3 is an enlarged top plan view of a typical pair of lenticular elements comprising a panel of the invention;

FIG. 4 is an enlarged top plan view of part of a panel of the invention shown in combination with a substrate carrying a series of regularly spaced apart photovoltaic ribbons for converting solar energy to electrical energy;

FIGS. 8 and 9 show an enlarged top plan view of two different positions of one half of a pair of panels of the invention structured to by themselves move and focus a strip image of the sun at a stationary location during the sun's diurnal motion.

DETAILED DESCRIPTION

This invention in general relates to solar energy collection and in particular to optical systems for concentrating solar energy onto receivers intended to convert it to another form. The optical systems of the invention comprise a basic optical structure in the form of a panel which is combined with like panels and also other components for the purpose of concentrating solar energy and which itself is useful for this purpose.

BASIC PANEL

Figure 2:
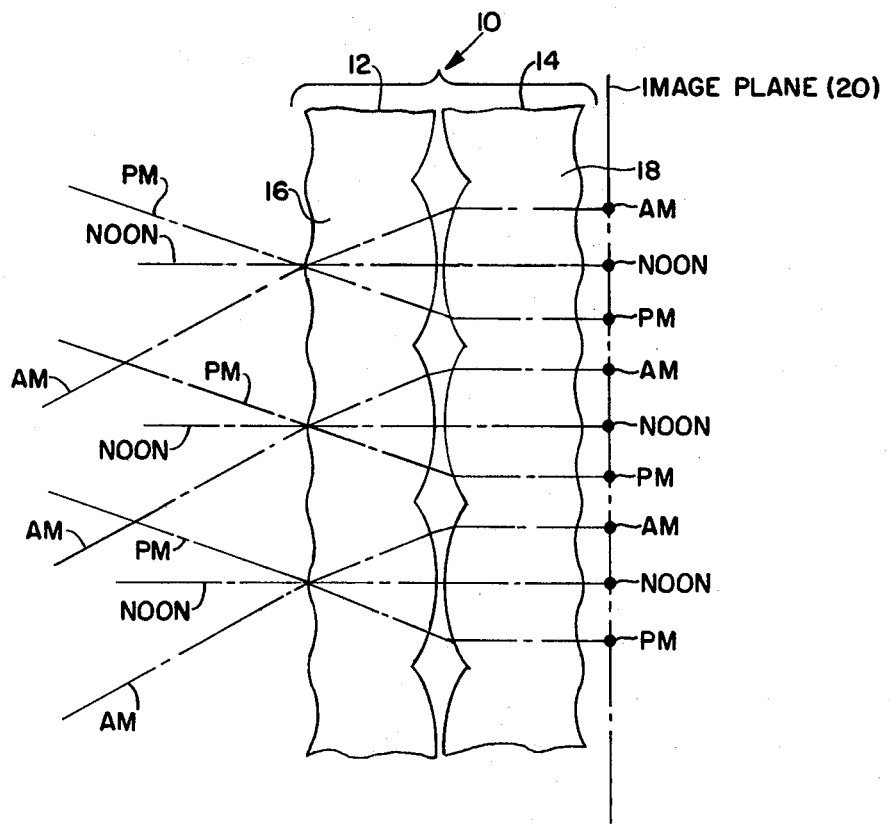
FIG. 2 is an enlarged cross-sectional view of part of an optical panel of the invention illustrating the location of the panel image plane and how strip images of the sun formed by the panel move in the image plane during the sun's diurnal motion.

As best shown in FIGS. 1 and 2, the basic panel, which is designated generally at 10, is formed of two plates, 12 and 14, formed of a series of regularly spaced apart lenticular, anamorphic elements designated generally at 16 and 18, respectively. The general form of the lenticular elements, 16 and 18, is shown in FIG. 3 wherein it can be seen that the element 16 comprises a first surface that is noncircular in section, a second surface which is preferably circular in section and concentric with the apex of the noncircular first surface but which may also be noncircular as described hereinafter. The element 18 is preferably identical with element 16 but opposed.

Thus plate 14 is identical to the plate 12, but opposed, so that parallel light from the sun, incident on the left as in FIG. 2 at some angle of incidence between sunrise and sunset, is refracted through the double-plated panel 10 to a closely adjacent plane 20 on the right, which plane is to be thought of as an image plane. The image plane 20 contains parallel narrow strip or ribbon images of the sun, one image from each pair of cylindrical elements, 16 and 18, of the two aligned plates, 12 and 14. The panel 10 is thus made up of side by side and aligned preferably identical cylindrical elements, 16 and 18, for whatever width of panel may be desired, and at whatever width and spacing may seem advantageous. Typically, however, a frequency of elements from perhaps two to the inch to perhaps 40 to the inch is reasonable before practical factors become controlling. If too low a frequency is considered, such as one element to the inch, the panel 10 with its two plates, 12 and 14, becomes excessively thick and uses too much material, or weighs too much, or is too expensive to fabricate. If too high a frequency is considered, such as 50 to the inch, the double plates, 12 and 14, may become too thin for rigidity, or may crack or tear, or be too fragile for handling. This is not to say that for quite other purposes, having a different set of tolerances and requirements, such as for photographic stereo films where even much higher frequencies must necessarily be used, one may indeed impress far higher frequencies onto a suitable film base. Insofar as the principles involved are unchanged, such high frequency impressions lie within the scope of this invention, even though not used purely for the collection of solar energy, but for sundry other purposes.

Insofar as the collection of solar energy is concerned, therefore, one may consider the frequency of the cylindrical elements as lying within the range of two to the inch to 40 to the inch, noting that other outlying frequencies may indeed be used without one's departing from the principles and spirit of this invention. Each element of the array is identical with and opposed to a mating element in the second layer of the panel, such that both share a common optical axis or centerline of the mated pair of elements as shown in FIG. 3. The two thus work together as an isolated optical system of two elements, focusing a narrow line image of the sun onto a focal line lying in the image plane adjacent to the exit face of the pair of elements, that is, to surface 4 of the pair as for an optical cylindrical system as a unit. The panel 10 as a whole thus produces a parallel array of equally spaced line images of the sun whose width for any one image is approximately 1 percent of the equivalent focal length of the pair of plates, 12 and 14, in transverse section, and whose length or height is that of the panel 10 itself. Focusing is therefore only in one azimuth, and at this stage one ends up with as many line images of the sun as there are elements or part-elements of the double-layered panel 10. For example, if one has four elements to the inch, the separation of the line images of the sun will be exactly 0.250 inches. If the elements of the panel 10 have a length or height of say 20 inches, then the line images of the sun will each be 20 inches long. If the focal length of an individual element is, say 0.138 inches as for Example 3 below, the width of each strip image of the sun will be approximately 0.0013 inches monochromatically but somewhat greater if the entire spectrum is taken into account with respect to this unachromatized system.

One very satisfactory form for the individual elements, 16 and 18, is comprised of identical but opposed so-called Schmidt lenses in one dimension or cross-section as shown in FIG. 3. The normal Schmidt type rotational lens is a thick lens whose axial thickness is equal to the radius of curvature of the rear dioptric surface, which lens admits of an aspheric front surface of such a shape as to correct for spherical aberration of the lens as a whole. The single Schmidt type rotational lens made up of any practicable kind of glass or plastic or crystal has a focal surface concentric with the radius of the spherical rear surface, that is to say, the rear dioptric surface and the focal surface share a common center of curvature lying at the vertex of the front aspheric surface. The focal surface lies in air and is thus separated from the rear dioptric surface. This normal type of single Schmidt rotational lens can be modified for special purposes, such that the thickness may be changed or the front aspheric surface given a superimposed dioptric power for the purpose of minimizing the aspheric depth or for minimizing the longitudinal chromatic aberration or for reducing the oblique spherical aberration, all of which are related. The rear dioptric surface may on occasion be made aspheric also, though generally with only a very weak departure from a sphere, or if cylindrical, from a circle. In special cases, the aspheric correction has been placed on one or both surfaces of a separate thin wafer element out in front, whereby the bulk of the system can be reduced to that of a single plano-convex thick lens element. In this instance, the aspheric correction lies at the refracted center of curvature of the rear surface, which then includes any necessary air space between the wafer element and the main body of the Schmidt lens. The focal surface may be moved to advantage also by some combination of these variants.

In the present invention use is made of two Schmidt type lenses, taken to be cylindrical for purposes of this invention, whereby the two type elements, 16 and 18, are back-to-back but opposed. The one Schmidt type element 16 complements the other 18 and the focusing action is greatly increased. The focal surface can be close in to the rear surface and in the limit the focal surface can be made to coincide with the rear surface of the double elements, 16 and 18, which will have the same noncircular cylindrical form as for the first surface of the pair of elements, 16 and 18. The so-called Petzval curvature of the pair of elements, 16 and 18, will be twice that of the single Schmidt type lens. In the case of a Schmidt type pair of rotational form, instead of cylindrical, the focal surface for an anastigmatic combination would be strongly concave. For the cylindrical case, as here, only the so-called tangential image surface is strongly concave if the pair of elements, 16 and 18, is tangentially in focus, but the skew focus is unfocusable or at best afocal. For a purely rotational system, optimum image quality would indeed be obtained on a strongly curved concave image surface. For the solar collector under consideration, however, a flat tangential field is required. To achieve this for the cylindrical Schmidt type pairs of elements, 16 and 18, large negative tangential astigmatism is introduced principally at the third surface of the four refractive surfaces, to such a degree that the tangential image surface is adequately flat. The unfocused blurring in the skew direction is of no consequence for purposes here, inasmuch as the blur lies strictly along the line image of the sun. The use of this result is all important for use of the cylindrical array of elements as a sun-tracker throughout the day.

The back-to-back cylindrical Schmidt type elements, 16 and 18, have very substantial optical power in spite of the relative simple construction, and indeed can be made to perform adequately at speeds of f/1 or even faster, over quite large fields of view, such as a total field of 120 degrees. In addition, there are other parameters available that depart from the strict Schmidt type principles, made feasible by the back-to-back pairing, which can be used to improve the imaging action as will be seen hereinafter. These include variations in lens thickness and air spacing, as well as variations in the noncircular parameters, even allowing the strong previously circular cross-section of surfaces 2 and 3 to become elliptical or possibly aconic, that is, departing from any second order surface. It has been observed that the departures from the Schmidt form are not very large by eye, but nevertheless at these low f-numbers, significant improvement can be obtained. In addition, it is not at all essential from an optical design point of view that the two Schmidt type elements, 16 and 18, of the pair be identical, though opposed, but from the point of view of low cost and ease of manufacture, the identity of parts is desirable. In any event, calculations indicate that even when the paired elements are strictly identical, satisfactory performance at f/1 can readily be obtained. This is all the more true as the index of refraction of the medium is increased.

Another important property of pair of elements, 16 and 18, is that the system has very pronounced distortion, which in this instance is a blessing. The prime cause of the distortion is the inward bending of the chief rays at the first surface which lies approximately, at least, at the center of curvature of the rear surface and which is also near or coincident with the adopted real pupil of the system. Indeed, this inward bending is the same that has received prominence at various times of the so-called fish-eye lens. This type of lens generally also makes use a of weak convexity of the first surface to increase the inward bending further. For a flat first surface, when the sun is on the horizon, the chief ray is refracted inwardly at the critical angle inside of the material, and the entire compass of the sky comprising an angle of 180 degrees, or $2\pi$, in the limit is compressed within a dihedral angle of twice the critical angle with respect to the normal. The diurnal apparent motion of the sun across the sky from dawn to dusk will thus find that within the glass or medium the associated chief rays will lie within the aforesaid dihedral angle. For the pair of cylindrical Schmidt type elements, 16 and 18, under consideration here concern is with compression only in one azimuth which is at right angles to the respective optical axes of the elements. The strip images are refracted inwardly in the nature of barrel distortion at the image plane 20.

There is also an inward dispersion of the chief rays that ruins the effectiveness of this arrangement for ordinary wide band purposes, whether for rotational or for cylindrical systems. Here, however, for collection of solar energy, precise imaging of the sun is not of great importance in view of the very large factor of energy concentration which may already exceed 100 or more. It is more important that distortion be made use of, as a consequence of the refractive Schmidt type form, to confine the excursion of the strip images of the sun across the field of view, which in effect further reduces the scale or equivalent focal length off-axis and reduces the angular rate of adjustment for the tracking of the sun when far off the meridian.

The inward refraction of the chief rays depends decidedly, therefore, on the index of refraction of the medium. If the extreme angle of incidence is taken to be 90 degrees, then for a flat surface or at least for a tangent plane, the critical angle is given by the arc sine of $1/n$. If $n=1.5$, as for crown glass, the critical angle is 41.8 degrees and the double angle 83.6 degrees. Thus the 180 degrees of the sky are compressed to 83.6 degrees. Use of so low an index means that barrel distortion is not pronounced, and that the early or late portions of the day will be lost to truncation of the field on either side of center, caused by the absence of overlap of successive cylindrical elements.

As shown in FIG. 4, the energy concentrated in these strip images can be absorbed by an array of hair-like, photovoltaic collectors 24 lying on a suitable heat resistant substrate 26. That is to say, the full field compressed within the double critical angle exceeds the width of the element in the image plane 20 and must therefore be truncated in effect at the intersection with the next element on either side. It will be noted that this discussion has for the moment referenced only azimuth tracking. However, other aspects or orientations of the panel 10 or panels are possible to favor sites or to track the sun in elevation rather than in azimuth.

If the index of refraction is taken to be 1.59 as for the plastic styrene, the critical angle reduces to 39 degrees and the double angle to 78 degrees. The barrel distortion is thereby increased and the entire sky of 180 degrees is compressed to within 78 degrees. This compression is still insufficient for dawn to dusk tracking and the outer field on either side is still partially truncated. If the index of refraction is taken to be 2.0 as for some glass types, crystals, and special plastics, the critical angle becomes 30 degrees and the double angle 60 degrees. At this index the full sky is so well compressed that dawn to dusk tracking at highest efficiency becomes possible. Beyond 60 degrees dihedral angle in object space, however, foreshortening at the oblique refraction causes a loss of area collection as the cosine, which at 60 degrees is already a 50 percent loss. As far as the cylindrical pair of elements, 16 and 18, is concerned, however, calculations show that truncation of the field by the adjacent elements is minimal. In the outer field there is some vignetting of the so-called upper rim rays caused by interaction with the next element and by the subsequent insufficient aperture of surfaces 2 and 3 of the pairing. This unavoidable vignetting can be used to reduce the aperture of the entrance pupil, which in turn reduces the most extreme refractive errors.

With exact symmetry of the double Schmidt-type cylindrical pair of elements, 16 and 18, parallel light from the sun is thus focused astigmatically onto the image plane 20 into strip images of the sun. Because of this same symmetry, chief rays in image space emerge parallel to one another and to the central optical axis of the panel 10 except for minor residual aberrations and chromatic spread. That is to say, parallel light from the right (see FIG. 2) would form an image at the center of the adopted entrance pupil. Light from the left parallel to the central axis forms a point image on the image plane 20 on the central axis at the location of the field stop after surface 4, analogous to the location of the entrance pupil in object space preceding surface 1.

Thus far, one panel consisting of paired refractive Schmidt type cylindrical elements aligned at equal spacings across the panel 10 has been described. The panel 10 achieves the focusing of very narrow strip images of the sun in parallel on the image plane 20 at the exact spacings of the center lines or optical axes of the respective elements. These strip images of the sun move as a group at constant separation from one to another within the image plane 20 during the diurnal motion of the sun. The collectors 24 (see FIG. 4) have precisely the same spacings across their matrix as for the array of elements, 16 and 18. Tracking of the sun throughout the day thus involves only the slight movement of the panel 10 relative to the collector array 22 and the amplitude of motion is at most the width of but one cylindrical element.

For an element frequency of four per inch, the total tracking motion through most of the day to keep the parallel strip images of the sun located precisely on the hair-like collectors 24 would be of the order of a lateral motion of 0.250 inches. If the entire panel 10 were to have a width in the direction of motion of say 20 inches (80 elements), then the panel as a whole would move at most only 0.250 inches and would require eight or more hours to do so as for Example 3 below. Miniaturization of the tracking motion has thus been achieved, regardless of however large the panel 10 may be. If a higher frequency of spacings were to be used, such as 10 to the inch, then the lateral tracking motion would not exceed 0.100 inches, etc. If the index of refraction were to be raised above two, then the tracking motion would be even less.

It is easy to see that the lateral motion of the panel 10 would be at an imperceptible rate and that the edges of the panel 10 can be concealed cosmetically within a framing to eliminate any exposed edges during the tracking motion. The tracking is not uniform in rate and indeed will have a rate dependent on the trigometric terms expressing relationships between the equatorial and alt-azimuth coordinate systems and to the orientation of the panel 10 at a site. If the sun is low in the sky, the tracking rate will be all the slower. Maximum rate occurs when the sun is on the celestial equator for tracking in azimuth. Minimum rate occurs when the sun is on the celestial equator for tracking in elevation, or more accurately, minimum rate occurs when the sun is on the meridian, for tracking in elevation. If tracking takes place near the summer solstice when the days are longest, the sun moves more than 180 degrees in azimuth throughout the day, which in turn would require placement of panels (10) in azimuth to divide such long days in half or thirds. The extensive foreshortening from such sweeps of the sun may also render such extra placements advisable.

At this stage of the invention, therefore, miniaturization and precision of tracking has been achieved by means of only a pair of slightly movable plates, 12 and 14, or a panel 10 containing parallel and equally spaced elements.

PANELS IN COMBINATION

Figure 7:
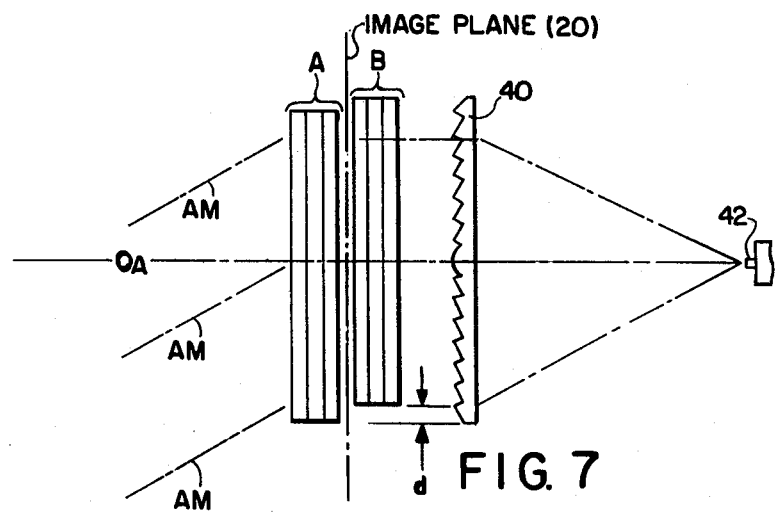
FIG. 7 shows a top plan view of two panels of the invention in combination with a Fresnel lens used for purposes of concentrating collimated solar energy emerging from the second panel onto a single photovoltaic ribbon.

From the description that follows, it will be seen that, when two of the basic panels 10 of the invention are arranged one behind the other to move relative to one another in their own planes, they can continuously collimate solar energy emerging from the second panel which can thereafter be focused onto a single narrow receiver. The arrangement for accomplishing this is shown in FIGS. 5, 6, and 7.

Figure 5:
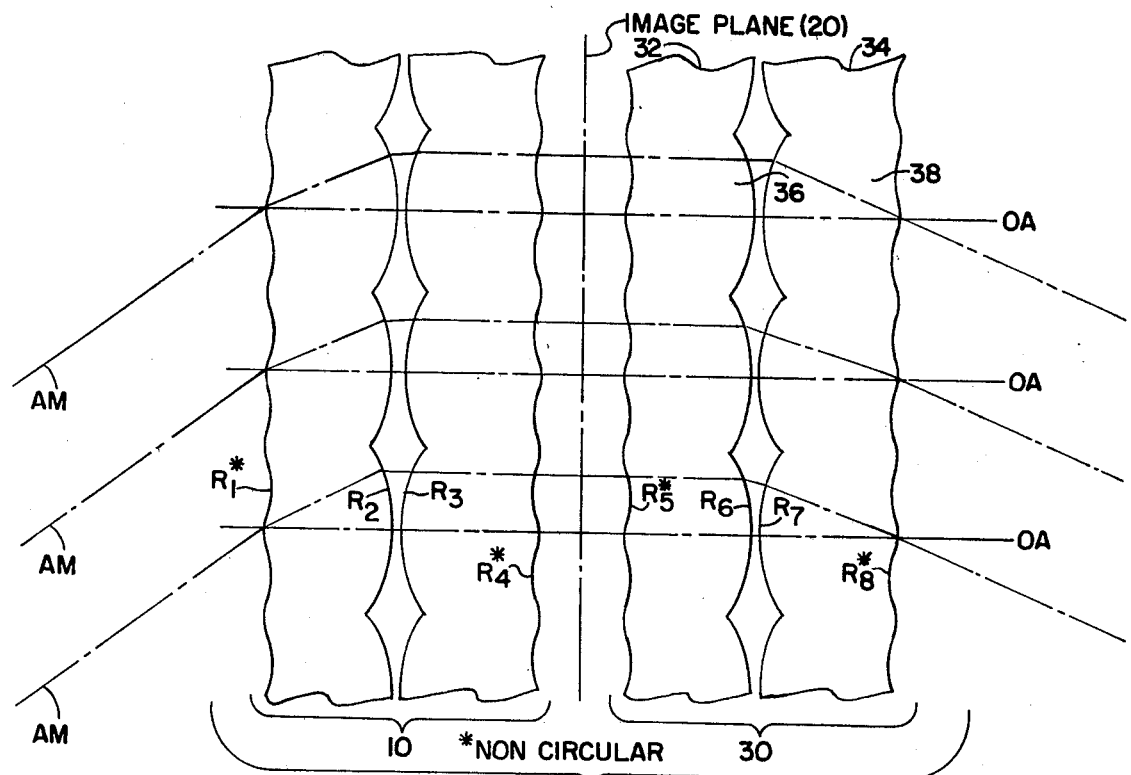
FIGS. 5 and 6 show enlarged top plan views of part of two panels of the invention in different relative positions to illustrate with accompanying traced rays the tracking capability of a pair of panels.
Figure 6:
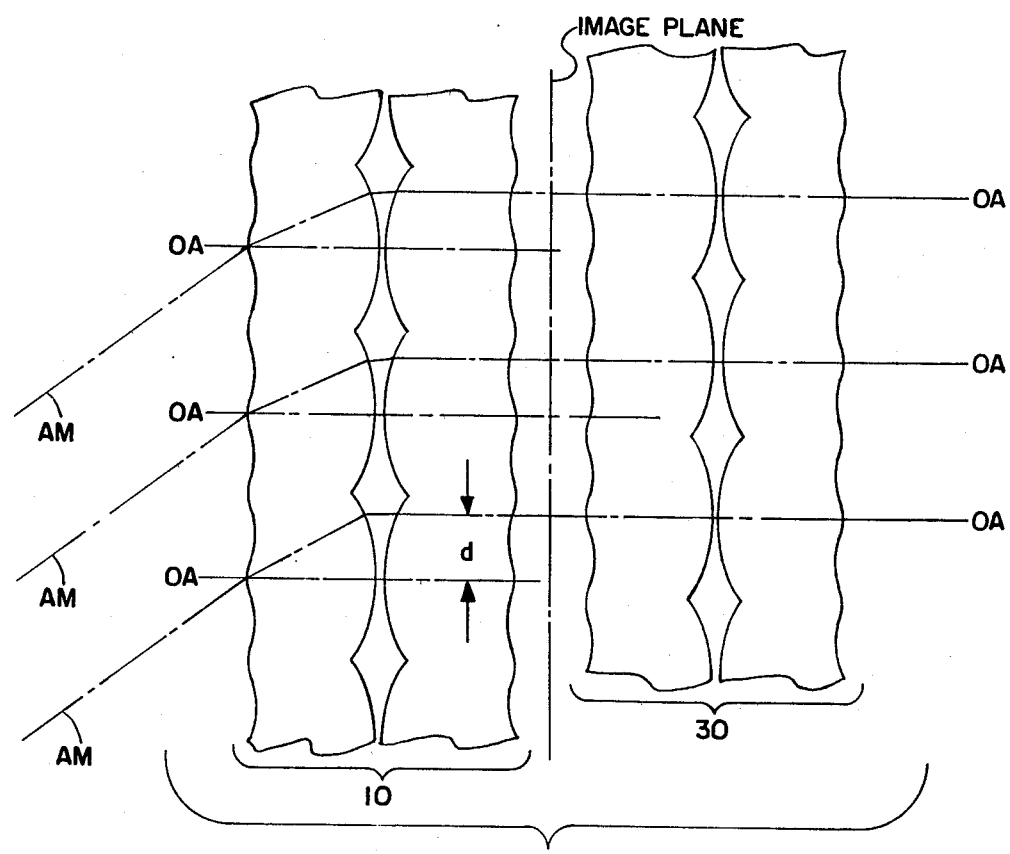

Referring now to FIG. 5, there is shown a second basic panel 30 positioned behind the first basic panel 10. The second panel 30 is preferably identical in structure to the first 10 and comprises first and second plates 32 and 34, respectively. The lenticular elements of the panel 30 are designated generally at 36 and 38 and the surfaces thereof are numbered 5 through 8, 5 being the first encountered and 8 the exit surface.

It will be apparent to those skilled in the art that when the second pair of plates, 32 and 34, and therefore the second panel 30 identical to the first, are placed in the follow-on position shown such that the image plane of the first becomes the object plane of the second, exactly the opposite refractions occur. Therefore, the light emerging from the second panel 30 is collimated as shown in FIG. 5. Chief rays which are parallel to the respective optical axes in the first image space converge on final image space at an exit pupil in all ways analogous to the entrance pupil in object space in size and location with respect to the adjacent refractive surfaces, 1 and 8. If in the diagram, the parallel light from the sun is taken to come from the left and moves toward the upper right through the entrance pupil of any given element of the panel 10, the recollimated light emerging from the corresponding and aligned elements of panel 30 goes downward toward the right as if back to a sun that is the mirror image of the real sun. In optical terms one has a magnification of $+1$. Since all elements of the second panel 30 are equally spaced and identical to one another, the various emerging bundles of parallel rays are also parallel to one another in final image space and no actual concentration of energy has as yet been achieved. These parallel bundles of emerging rays can be made to be parallel to the optical axes of the respective panels, 10 and 30, by selectively displacing the panels, 10 and 30, through a distance, d, relative to one another as shown in FIG. 6. With a supplemental use of a Fresnel converging sheet-lens such as shown at 40 in FIG. 7, these parallel bundles of light can be brought to a common focus onto a single strip collector 42 having a width about 1 percent of the focal length of the add-on Fresnel lens 40. Use could also be made of any ordinary reflective cylindrical collector for the reimaging needed. It will be shown below in the section on Auto-Focusing Panels, however, that the additional Fresnel lens 40 or a reflective cylindrical collector is not needed.

Clearly, the tracking feature has not been destroyed by this more complex arrangement. If the first double-layered panel 10 is moved laterally, the image formed by the supplemental Fresnel 40 can be held stationary at any given position in final image space, to the right say of the panel 30, as the sun traverses the sky. The miniaturization of tracking thus remains unaffected. A large array of such panels, 10 and 30, can be placed approximately in the same transverse plane, just to broaden the total array that can be used to feed stationary collimated sunlight to some rather large reflective parabolic cylinder (instead of the Fresnels), which parabolic cylinder in turn need not track or be movable since the panels, 10 and 30, do the tracking. For example, panels eight feet wide and 20 feet long can be used at a time to feed parallel rays of stationary collimated sunlight to an equally large fixed reflective collector of mirror aluminum, which then forms a very concentrated ribbon image of the sun, also 20 feet long. If a reflective refocusing system is employed, at f/1 say, the focal length would be eight feet and the width of the sun's image about 0.90 inches, and the concentration factor about 107. There would be other degradation of efficiency, however, alluded to earlier.

AUTO-FOCUSING PANELS

Fortunately, the Fresnel sheet-lens 40 or a reflective collector in the final image space is not required at all. The second panel can do its own focusing at once in a very natural and effective way. An additional purpose of this invention, therefore, is to provide for focusing of the output light onto a single ribbon of photovoltaic material at f-numbers as fast as f/0.9 in but the one direction. Since a narrow strip image of the sun in final image space will be very hot, the front surface of the first panel, 10, can, if necessary, be coated to reflect away portions of the solar spectrum not used by the photovoltaic collector. For silicon the wavelengths actually needed run from about 550 nm at the shorter wavelength to about 1050 nm at the longer.

To understand the use of a second double-layered panel for focusing, note that in tracking one moves only panel 10 with respect to 30. If the second panel is identical to the first, one can readily bring all of the equally spaced narrow images of the sun onto the respective equally spaced optical axes of the second panel. The emerging light, as discussed earlier, comes out collimated and parallel to the optical axes, which are all parallel to one another anyway, and is unfocused. Now, however, for a focusing mode, let us change the successive spacings of the elements of panel 30 in the way shown in FIG. 8, where modified panel 30 is now shown as 30', such that the narrow images of the sun are off-axis by a selective amount, s, for any given element to have the emerging bundle of rays for that element emerge at a pre-disposed angle. The light rays within any single bundle emerge parallel to one another within the bundle for any given element, but the elementary bundle as a whole shares the pre-disposed angle. The emergent slope angles are therefore controllable by selectively offsetting the optical axes of the second panel 30' with respect to corresponding elements of the first panel 10 and therefore can be made to focus in final image space.

Figure 9:
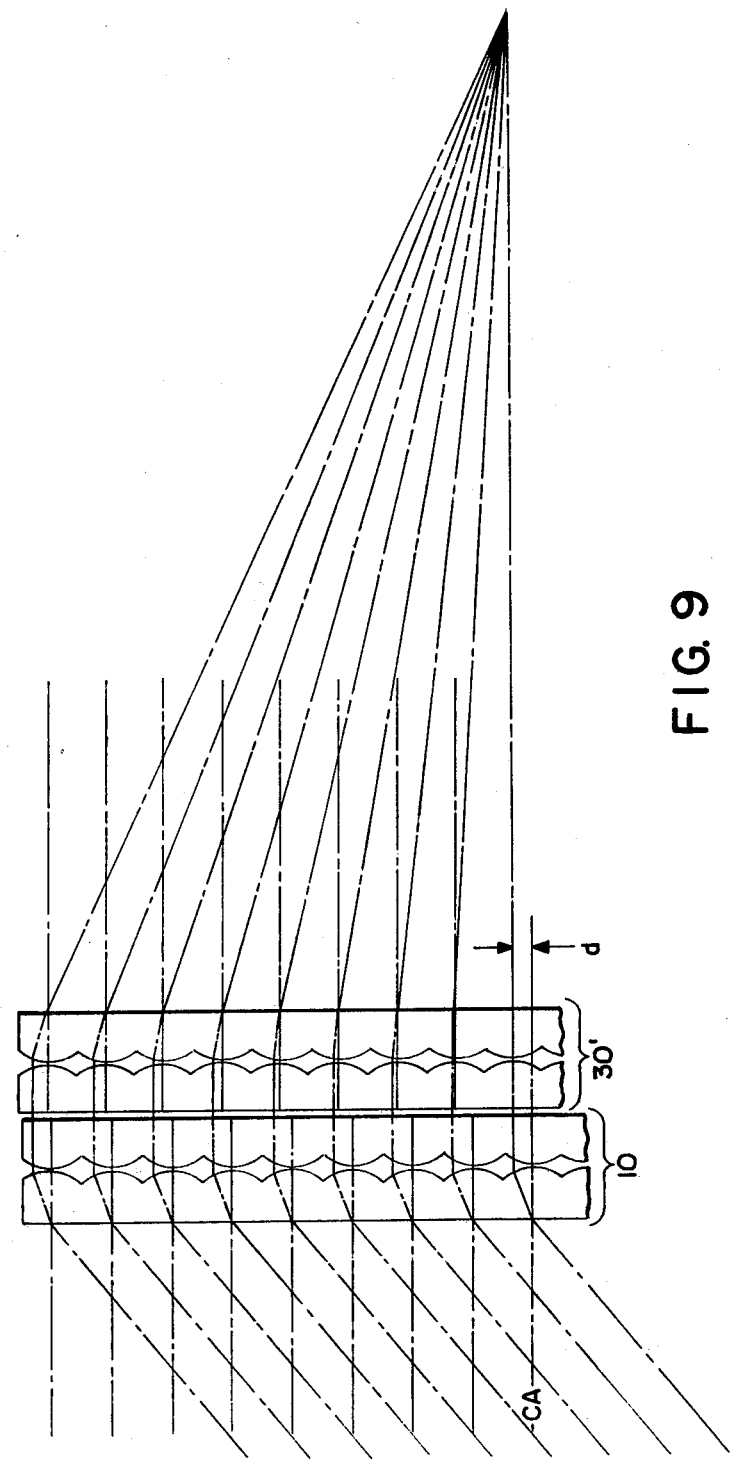

Thus, one can direct the bundle from any pair of elements to an adopted focal point that may be placed for convenience on the central optical axis, CA, of the panels 10 and 30'. Any other adopted focal position can be used, if some special need is to be met. For an example, I have calculated a 5×5-inch panel with a spacing of four to the inch for panel 10, comprising 19 full elements and one half element on either side, if unbeveled. The present calculations are based on having a focal position in final image space of 4.000 inches along the central optical axis, CA, from the exit pupil for the central element, which pupil has been taken to lie at a distance of 0.0047 inches out in air just beyond the last surface of the panel 30' central element. Indeed, each element above and below the central axis has its own exit pupil at the displacement in air of 0.0047 inches. Collimated bundles of rays from any one element thus send the constituent rays through the adopted focal point incoherently, forming therefore a coalescing of many separate images into a slightly blurred composite. Since the entire array operates at a lateral magnification of one-to-one, the angular subtense of the sun in final image space remains as in object space, and the common image so formed approximates a width of 0.037 inches. Thus, a 5×5-inch compounded panel can be made to focus the transmitted energy onto a strip image of the sun 0.037 inches wide in the mean wavelength and 5 inches long. A small tracking motion, d, (FIG. 9) of panel 10 with respect to panel 30' is then all that is required to keep the composite image fixed on a photovoltaic ribbon collector. The quality of focusing is maintained over the full range of tracking, since the images formed by first panel 10 are always brought back to the same position required for focusing by the second panel 30', element by element, without error.

A further bonus arises from this arrangement. First of all, the focusing is precise even though the optical systems have abundant distortion and variable tracking rates for the first panel 10 as a whole. The bonus is that internal focusing of any the individual bundle of rays can be achieved simply by the usual focusing longitudinally of the second panel 30' with respect to the first panel 10. That is to say, one changes the air-space between the panels, 10 and 30', while keeping the panels, 10 and 30', parallel to one another, that is, untilted, which is a normal focusing mode. This simple procedure works because the chief rays in the central air space between the panels, 10 and 30', are parallel to the respective optical axes and the narrow image formed on each optical axis by the first panel becomes the object for the corresponding element of the seocnd panel. A change in the air space thus affects the object distance for the second panel elements which then changes the image position, which effect is used for focusing to the desired image point. Thus, we now have not only all the bundles going through the adopted focal position but the respective small bundles of rays arriving there can be individually sharply focused. The monochromatic image of the sun can thus be quite well defined, the residual errors depending on chromatic aberration and on high obliquity of the outlying elements of the second panel 30'. There is also a slight additional error of focus caused by the fact that the outlying bundles have farther to go to reach the adopted focal position. The individual elements are focusing, however, at about f/20 and the depth of focus is large.

It is to be noted that the typical optical elements for each plate are non-achromatized and therefore produce color dispersion both laterally and longitudinally. Composite strip images of the sun therefore have strongly colored edges and the effective width of the sun's image is widened somewhat by these chromatic aberrations. Errors of fabrication will tend to widen the solar image, as will thermal errors if the panels are made of plastic medium. Consequently, for the purpose of estimating the net efficiency of the arrangements, it might conservatively be said that all of the light transmitted to an assigned focus by the panels will lie easily within a total compass of perhaps twice the mathematically derived monochromatic solar image, which will reduce the gain, for example, for the 5×5-inch panel operating at f/0.94 to a level of about 50-fold of the panels over the direct sunlight. There is a further loss by vignetting which will be discussed further below. This gain factor does not include the normal quantum efficiency of the detector which may be of the order of 20%, nor the waste of energy outside the sensitive bandwidth of the collector, both of which are present for the direct incidence solar cell. All things considered. including tracking irregularities, a gain factor of about 50 might be settled on as one to be anticipated for the collection of yellow to near infrared solar energy between say 8 AM and 4 PM. For higher off-normal angles, consideration also must be given to the increasing foreshortening losses at the higher angles, which for 60 degrees off the normal already reaches 50 percent. For early morning and late afternoon collection and particularly for the summer early mornings and late afternoons, three arrays of panels might be employed suitably oriented to bracket the full range of angles and for any given site study might also be made of any advantages offered by a 90-degree turn of the panels for tracking in elevation.

Tracking may be effected either by tracking in elevation (altitude of the sun) or by tracking in azimuth. One or the other may be advantageous according to the latitude of the site and according to the slope, if any, of the roof or base, and if sloped, according to the most favorable aspect at the location. That is, other buildings or trees might interfere from adjacent properties. In any event, a coordinate transformation between the alt-azimuth and equatorial systems must be effected, either by appropriate mechanical devices or by way of a small computer. Generally, some small portion of a large array can be assigned just to closed loop tracking and the rest of the array, however large, can be slaved accordingly.

EXAMPLES

Examples of constructional data for the form of the individual cylindrical optical elements comprising panels embodying the invention will now be taken up.

The first example, which is of polystyrene, is intended for use as a non-focusing panel to be moved for purposes of tracking to concentrate solar energy onto a stationary array of regularly spaced apart silicon ribbons as in the arrangement of FIG. 4. The constructional data given in the table below is to be referred to FIG. 3 which shows a typical element pair.

EXAMPLE 1
(Refer to FIG. 3)

| Surface | Radius | Separation Medium | Air | $N_e$ | $V_d$ |
|---|---|---|---|---|---|
| 1 | +3.170* | 1.175 | | | |
| | | | | 1.596 | 30.8 |
| 2 | −1.195 | | 0.170 | | |
| 3 | +1.195 | 1.175 | | | |
| | | | | 1.596 | 30.8 |
| 4 | −3.170* | | | | |

*noncircular in which the surfaces are numbered in ascending order from object to image space, the radii and separations are normalized to a focal length of $f_e = 1.0$, $N_e$ is the index of refraction at 546.1 nm, $V_d$ is the Abbe dispersion number and wherein surfaces 1 and 4 are noncircular in cross-sectional shape and have the general formula:

$$Z = \frac{CS^2}{1 + \sqrt{1 - C^2 S^2}} + \beta S^4 + \gamma S^6 + \delta S^8 + \epsilon S^{10}$$

where $C$ is the reciprocal of the surface apex radius, $Z$ represents the distance of a point measured from the surface vertex and parallel to the Z-axis, taken to be the optical axis, and $S$ is the radial distance of the point measured perpendicular to the Z-axis and wherein the coefficients, $\beta$ through $\epsilon$, normalized to $f_e$, are given in the following table:

| | Surface | |
|---|---|---|
| | 1 | 4 |
| C | 0.3155 | −0.3155 |
| beta | −2.003 × 10$^{-1}$ | +2.003 × 10$^{-1}$ |
| gamma | +2.517 × 10$^{-3}$ | −2.517 × 10$^{-3}$ |
| delta | −3.971 × 10$^{-1}$ | +3.971 × 10$^{-1}$ |
| epsilon | −6.703 × 10$^{-2}$ | +6.703 × 10$^{-2}$ |

With a focal length of F for a pair of elements for this example, the number of elements per inch will be 1/F and the width of each strip image formed is equal to F/107 approximately. The size of azimuth angle covered is 45-leg and the tracking movement required to keep the strip images registered with the silicon array for this aximuth angle range is approximately 0.83F.

In this example, the entrance pupil lies in object space and is located at a distance of 0.024 along the axis from the vertex of $R_1$. Similarly, the exit pupil lies in image space at infinity with respect to the vertex of $R_4$.

This example may also be used in the form of two panels of like construction for a tracking version in which the panels move relative to one another.

As a second example, for a pair of panels to be made of SF-6 and moved relative to one another and used in combination with a Fresnel focusing lens, reference may be had to FIG. 5 and the following Table for the constructional data of the individual elements.

EXAMPLE 2
(Refer to FIG. 5)

| Surface | Radius | Separation Medium | Air | $N_e$ | $V_d$ |
|---|---|---|---|---|---|
| 1 | 5.022* | 1.507 | | | |
| | | | | 1.8127 | 25.43 |
| 2 | −1.684 | | 0.0084 | | |
| 3 | +1.684 | 1.507 | | | |
| | | | | 1.8127 | 25.43 |
| 4 | −5.022* | | 0.0674 | | |
| 5 | 5.022* | 1.507 | | | |
| | | | | 1.8127 | 25.43 |
| 6 | −1.684 | | 0.0084 | | |
| 7 | +1.684 | 1.507 | | | |
| | | | | 1.8127 | 25.43 |
| 8 | −5.022* | | infinity | | |

*noncircular in which the above data is presented in the same form as that for Example 1 and wherein the aspheric coefficients for surface 1 are:

| | 1 |
|---|---|
| C | 0.1991 |
| beta | −8.138 × 10$^{-2}$ |
| gamma | −3.784 × 10$^{-2}$ |
| delta | −4.652 × 10$^{-2}$ |
| epsilon | −1.522 × 10$^{-2}$ | and the same for surfaces 4, 5, and 8 with regard for algebraic signs.

The entrance pupil lies in object space and is located at a distance of 0.0337 along the axis from the vertex of $R_1$. Similarly, the exit pupil lies in image space and is located beyond the vertex $R_8$ by the axial distance of 0.0337.

A third example of the constructional data for individual elements comprising a pair of panels intended to both focus and track is given in the following table where the data is to be interpreted as in the previous examples except that the data has been normalized with respect to the focal length $f_s = 1.0$ with reference to 852.1 nm.

EXAMPLE 3
(Refer to FIG. 5)

| Surface | Radius | Separation Medium | Air | $N_s$ | $V_d$ |
|---|---|---|---|---|---|
| 1 | 5.258* | 1.521 | | | |
| | | | | 1.8205 | 23.83 |
| 2 | −1.697* | | .0085 | | |
| 3 | +1.697* | 1.521 | | | |
| | | | | 1.8205 | 23.83 |
| 4 | −5.258* | | .0679 | | |
| 5 | 5.258* | 1.521 | | | |
| | | | | 1.8205 | 23.83 |
| 6 | −1.697* | | .0085 | | |
| 7 | +1.697* | 1.521 | | | |
| | | | | 1.8205 | 23.83 |
| 8 | −5.258* | | infinity | | |

*noncircular

The entrance pupil lies in object space and is located in air at a distance of 0.0339 along the axis from the vertex of $R_1$. Similarly, the exit pupil lies in image space and is located in air beyond the vertex of $R_8$ by the axial distance of 0.0339.

$C_1 = 0.1902$
Beta $= -6.141 \times 10^{-2}$
Gamma $= -6.059 \times 10^{-2}$

Delta = −3.866×10⁻²
Epsilon = −1.376×10⁻²
Zeta = +2.146×10⁻⁵ and the same for surfaces 4, 5 and 8, with regard for algebraic signs.

Surfaces 2, 3, 6 and 7, while identical but with regard to algebraic sign, are in this instance approximately ellipsoidal. The noncircular coefficients given below for these surfaces are then to be regarded as aconic as well as noncircular.

$C_2 = -0.5894 = C_3 = +C_6 = -C_7$
$e_2{}^2 = 0.2622 = e_3{}^2 = e_6{}^2 = e_7{}^2$
Beta = 0.000
Gamma = −1.356×10⁻²
Delta = −8.897×10⁻⁵
Epsilon = +1.950×10⁻⁴
Zeta = +3.800×10⁻⁵ and the same for surfaces 3, 6 and 7 with regard for algebraic signs.

In the above data the general form of the noncircular surfaces is given by:

$$Z = \frac{CS^2}{1 + \sqrt{1 - C^2S^2(1-e^2)}} + \beta S^4 + \gamma S^6 + \delta S^8 + \epsilon S^{10} + \zeta S^{12}$$

where e represents the conic constant and other terms are as previously described.

In FIG. 5 for this example, the sunlight strikes the front face of the left-hand panel 10, at a dihedral angle with repect to the normal. This dihedral angle becomes the off-axis angle for the refraction. An entrance pupil for any given element is located in air to the left of the first surface, or indeed, may be on the surface exactly. For Example 3 with a focal length of 0.1376 inches, an axial displacement of 0.0047 inches has been adopted in object space between the entrance pupil (real stop) and the first surface. The course of typical chief rays are shown in FIG. 5 for single elements of the system up to and as far as the adopted image plane for the first panel which consists of refractive surfaces 1, 2, 3 and 4. Surfaces 1 and 4 are identical, and 2 and 3 are identical, though opposed. The image plane in Example 3 has been taken to lie also at the distance of 0.0047 inches to the right of surface 4, and otherwise is nominally halfway between surfaces 4 and 5. The image plane then in turn becomes the object plane for the second panel, and lies at a distance of 0.0047 inches to the left of surface 5, prior to focusing, if needed, this object distance being along the optical axis of the element. The respective chief rays, and in FIG. 5 the typical chief ray, are parallel to the common axis within the precision of the system. If the corresponding axes of the first and second panels are precisely aligned, then the typical chief ray refracts through the second panel and emerges on the right as a ray passing accurately through the exit pupil of the system at a distance of 0.0047 inches to the right of surface 8 on the respective optical axis. The displacements adopted for Example 3 are not restrictive but only by way of an example, and other reasonable values may be used. Moreover, some departure from the exact symmetry can readily be accommodated without departure from the meaning of the array.

The two plates of the first panel 10 are to be contained in a common cell and are intended to be rigidly coupled or cemented together as may be, in order that the two plates share common respective optical axes, that is, are in registration. The two plates thus provide for each element an optical objective of two elements that can be calculated to operate at a speed as fast as f/1 or faster, according to the index of the medium and according to the precision required in the solar image. Similarly, the two plates of a second panel 30 are to be rigidly coupled together in a separate single cell, and the respective axes are shared by the corresponding elements of the two layers, precisely.

The tracking mode is effected entirely by the relative movement of both panels. The array of equally spaced strip images in the image plane of the first panel 10 moves slowly in the image plane 20 according to the dihedral angle of incidence which in turn is related to the position of the sun with respect to the normal of the panels, 10 and 30. These respective narrow strip or ribbon images of the sun become the object strip or ribbon source-lines for the second panel 30. With relative movement between the panels, 10 and 30, the recollimated bundles and where desired, the focused bundles, emerge from the second panel 30 in some direction dependent on the displacement between the panels, which in urn, depends on the index of refraction of the adopted medium and on the spacing of the elements. If the second panel 30, as shown in FIG. 5, were to be identical to the first panel but opposed, the emergent bundles are parallel to one another and are unfocused. Other means are provided if a nearby focus is desired, as discussed earlier. Where the spacings of the elements in the double-plated second panel 30 are assigned preferred and calculated values as shown in FIG. 8, then the emergent bundles of rays from the array of elements can be caused to pass through a common focus, that is, are focused in sheets through a common focal strip and coalesce in a composite image. For Example 3, which can be made to focus in this manner, the final lens speed in one direction is nominally f/0.94.

Table 1 below gives the spacing for the first panel 10 for Example 3, which is a 5×5-inch array containing 19 full elements and portions of two more, one on either side.

TABLE 1

| Sequence Number | Distance From Central Axis | First Differences | Second Differences |
|---|---|---|---|
| 0 | 0.000000 | | |
| | | 0.250000 | |
| 1 | 0.250000 | | 0.000000 |
| | | 0.250000 | |
| 2 | 0.500000 | | 0.000000 |
| | | 0.250000 | |
| 3 | 0.750000 | | 0.000000 |
| | | 0.250000 | |
| 4 | 1.000000 | | 0.000000 |
| | | 0.250000 | |
| 5 | 1.250000 | | 0.000000 |
| | | 0.250000 | |
| 6 | 1.500000 | | 0.000000 |
| | | 0.250000 | |
| 7 | 1.750000 | | 0.000000 |
| | | 0.250000 | |
| 8 | 2.000000 | | 0.000000 |
| | | 0.250000 | |
| 9 | 2.250000 | | 0.000000 |
| | | 0.250000 | |
| 10 | 2.500000 | | |

Dimensions in inches.

Column 1 gives the sequence number in which the central element is counted as sequence number 0. The optical axis of Element 1 lies 0.2500 inches from this central axis, for Element 2, 0.50000 inches, for Element 3, 0.7500 inches, etc. in accordance with the second column. The third column gives the first differences which indeed are constant, and the fourth column gives the second differences, which are therefore zero.

Table 2 below gives the corresponding spacings calculated for an f/0.94 nominal system for the second panel 30 (where both panels are made up of an optical medium known as SF-57 in the Schott catalog, and is readily available from most manufacturers of optical glass).

TABLE 2

| Sequence Number | Distance From Central Axis | First Differences | Second Differences |
|---|---|---|---|
| 0 | 0.000000 | | |
| | | 0.241697 | |
| 1 | 0.241697 | | 0.000081 |
| | | 0.241778 | |
| 2 | 0.483475 | | 0.000159 |
| | | 0.241937 | |
| 3 | 0.725413 | | 0.000230 |
| | | 0.242167 | |
| 4 | 0.967581 | | 0.000291 |
| | | 0.242459 | |
| 5 | 1.210040 | | 0.000341 |
| | | 0.242801 | |
| 6 | 1.452842 | | 0.000379 |
| | | 0.243180 | |
| 7 | 1.696022 | | 0.000404 |
| | | 0.243584 | |
| 8 | 1.939607 | | 0.000417 |
| | | 0.244002 | |
| 9 | 2.183609 | | 0.000420 |
| | | 0.244422 | |
| 10 | 2.428032 | | |

Dimensions in inches (truncated but not rounded off).

The first column again gives the sequence number, whether to the right or left of the central element which has the sequence number 0. The first element to the right has an optical axis displaced from the central axis by the distance 0.2417 inches, for the second to right of center 0.4835 inches, for the third 0.7254 inches, etc. in accordance with the values given in the second column. The third column gives the first differences which for the second panel are variable, but in just such a way that the emergent bundles focus at a final image located 4.0047 inches from the surface 8 on the optical axis of the central element. The fourth column gives the second differences which serve only as a check on the smoothness of the computations, and for the latter reason are employed to even higher accuracy in the actual calculations.

In FIG. 5, suitable for Examples 1 and 2, the emergent bundles of rays are parallel and unfocused. It is evident that if there is a relative movement between panels 10 and 30, the direction of the emergent collimated light can be controlled, that is, tracked. Examples 1 and 2, again, were calculated for the media polystyrene and SF-6 respectively.

In FIG. 8, an effort is made to show how the focusing action of Example 3 is effected. At the uppermost element, the displacement of the line object from the optical axis for that element determines the direction of the emergent bundle of rays from that element and in particular is chosen to pass through the desired final strip image. An intermediate element has its line object somewhat less displaced from the respective optical axis of that element, but in such a way that the emergent bundle again passes through the desired final strip image. In actual practice a precision of perhaps 0.0001 inches in x and y between the mathematical and the manufactured surface points can be readily tolerated or accommodated.

For Example 3, which has been calculated for 5×5-inch panels and for SF-57, it will be of interest to note that surfaces 1, 4, 5 and 8 are identical except for aspect. Surfaces 2, 3, 6 and 7 are identical also, except for aspect.

It will be obvious to those skilled in the art that other changes may be made in the above-described embodiments without departing from the scope of the invention. Therefore, it is intended that all matters contained in the above description or shown in the accompanying drawings shall be interpreted as illustrative and not in a limiting sense.

What is claimed is:

1. An optical panel comprising a pair of thin refracting plates each of which includes a series of regularly spaced cylindrical lenticules, said plates being arranged in opposed spaced apart relationship so that their cylindrical lenticules optically align as associated pairs, each associated pair of said cylindrical lenticules being optically configured to form a well-corrected line image of a distant point source and having a flat tangential field over the width of the last lenticular element of the pair and over a substantial field angle so that each line image formed by an associated pair of elements always lies in substantially the same plane.

2. The optical panel of claim 1 wherein the spatial frequency of each of said lenticular plate elements is within the range of 2 to 40 per inch.

3. The optical panel of claim 1 wherein the refracting surfaces of associated pairs of said lenticular elements of said plates, are of cross-sectional form from object to image space, noncircular, negative, positive, and then noncircular.

4. The optical panel of claim 3 wherein said negative and positive refracting surfaces are circular in cross section and each is substantially concentric about the apex of a corresponding one of said noncircular surfaces.

5. The optical panel of claim 1 wherein the width of each of said line images formed by an associated pair of said lenticular elements of said plates is approximately one percent of the equivalent focal length of the pair in transverse section and whose length or height is that of said panel itself.

6. The optical panel of claim 5 further comprising a series of regularly spaced apart thin receivers mounted on a substrate and each having a width that is at least as large as that of said line images and a spatial frequency substantially the same as that of said lenticular elements of said plates and means for moving said substrate and said panel relative to one another in said image plane to keep said receivers in registration with said line images as the sun changes position during the day.

7. The optical panel of claim 1 wherein the medium of said plates has a refractive index of at least 1.5.

8. The optical panel of claim 1 wherein an associated pair of said lenticular elements of said plates of focal length, $f_e = 1.0$, has constructional data substantially in accordance with the following table:

| Surface | Radius | Separation | | $N_e$ | $V_d$ |
| | | Medium | Air | | |
|---|---|---|---|---|---|
| 1 | 3.170* | 1.175 | | | |
| | | | | 1.596 | 30.8 |
| 2 | −1.195 | | .0170 | | |

-continued

| Surface | Radius | Separation Medium | Air | $N_e$ | $V_d$ |
|---|---|---|---|---|---|
| 3 | +1.195 | 1.175 | | | |
| | | | | 1.596 | 30.8 |
| 4 | −3.170* | | | | |

*noncircular in which said surfaces are the surfaces of said elements in numerical order from object to image space, said radii and spacings are normalized to $f_e = 1.0$, $N_e$ is the index of refraction at 546.1 nm, $V_d$ is the Abbe dispersion number, and wherein said noncircular surfaces have shapes in accordance with the general formula:

$$Z = \frac{CS^2}{1 + \sqrt{1 - C^2 S^2}} + \beta S^4 + \gamma S^6 + \delta S^8 + \epsilon S^{10}$$

where C is the reciprocal of the surface apex radius, Z represents the distance of a point on the noncircular surface measured from the surface vertex and parallel to the Z-axis taken as the optical axis, and S is the radial distance of the point measured perpendicular to the Z-axis and wherein the coefficients, $\beta$ through $\epsilon$, normalized to $f_e$, are given on the following table:

| | Surface | |
|---|---|---|
| | 1 | 4 |
| C | 0.3155 | −0.3155 |
| beta | −2.003 × 10⁻¹ | +2.003 × 10⁻¹ |
| gamma | +2.517 × 10⁻³ | −2.517 × 10⁻³ |
| delta | −3.971 × 10⁻¹ | +3.971 × 10⁻¹ |
| epsilon | −6.703 × 10⁻² | +6.703 × 10⁻² |

9. An optical system for collecting and forming a series of regularly spaced apart narrow collimated beams of solar radiation, said system comprising:

(a) a first pair of thin lenticulated plates arranged in opposed spaced apart relationship with respective cylindrical lenticules optically registered with corresponding ones on an oppositely facing plate, said lenticules being structured to form a series of regularly spaced apart line images of the sun, one line image for each associated pair of lenticular elements on said plates, all of said line images moving as a group a distance no more than the width of one of said lenticules in a plane behind said plates during substantially the full diurnal motion of the sun; and (b) a second pair of lenticulated plates substantially identical in structure to said first pair of plates and mounted in registration for movement together in a plane parallel to said image plane of said first pair of plates, said second pair of plates, when the optical axes of its lenticular elements are respectively aligned with said strip images formed by said first pair of plates such that said images formed by said first pair of plates serve as the objects for said second pair of plates, operating to cause effectively the opposite refractions caused by said first pair of plates whereby as the sun moves, and consequently said strip images, said second pair of plates can be moved so that the solar energy entering said first pair of plates can be made to continuously emerge from said second pair of plates throughout the day as a series of regularly spaced apart narrow collimated beams of solar radiation.

10. The optical system of claim 9 further including means for moving said first and second panels relative to one another to track said strip images formed by said first pair of plates in accordance with the diurnal movement of the sun.

11. The optical system of claim 9 or 10 further including positive optical means for converging said collimated series of regularly spaced apart narrow collimated beams of solar radiation into a single narrow strip at which a receiver can be placed for converting solar radiation to another form.

12. The optical system of claim 9 wherein the spatial frequency of all of said plate lenticular elements is within the range of 2 to 40 per inch.

13. The optical system of claim 9 wherein the refracting surfaces of associated pairs of said lenticular elements of said first and second pair of plates in the direction of solar energy traveling through them are in transverse section of the form noncircular, negative, positive and then noncircular.

14. The optical system of claim 13 wherein said negative and positive refracting surfaces are circular in transverse section and each is substantially concentric about the apex of a corresponding one of said noncircular surfaces.

15. The optical system of claim 9 wherein the width of each of said line images formed by an associated pair of said lenticular elements of said first pair of plates is approximately one percent of the equivalent focal length of said first pair in transverse section and whose length or height is that of said first pair of plates themselves.

16. The optical system of claim 9 wherein the medium of all of said plates has a refractive index of at least 1.5.

17. The optical system of claim 9 wherein said lenticular elements for both pairs of said plates each of focal length, $f_e$, have constructional data substantially in accordance with the following table:

| Surface | Radius | Separation Medium | Air | $N_e$ | $V_d$ |
|---|---|---|---|---|---|
| 1 | +5.022* | 1.507 | | | |
| | | | | 1.8127 | 25.43 |
| 2 | −1.684 | | 0.0084 | | |
| 3 | +1.684 | 1.507 | | | |
| | | | | 1.8127 | 25.43 |
| 4 | −5.022* | | 0.0674 | | |
| 5 | +5.022* | 1.507 | | | |
| | | | | 1.8127 | 25.43 |
| 6 | −1.684 | | 0.0084 | | |
| 7 | +1.684 | 1.507 | | | |
| | | | | 1.8127 | 25.43 |
| 8 | −5.022* | | infinity | | |

*noncircular in which said surfaces are the surfaces of said elements in numerical order from object to image space, said radii and spacings are normalized to $f_e = 1$, $N_e$ is the index of refraction at 546.1 nm, $V_d$ is the Abbe dispersion number, and wherein said noncircular surfaces have shapes in accordance with the general formula:

$$Z = \frac{CS^2}{1 + \sqrt{1 - C^2 S^2}} + \beta S^4 + \gamma S^6 + \delta S^8 + \epsilon S^{10}$$

where C is the reciprocal of the surface apex radius, Z represents the distance of a point on the noncircular surface measured from the surface vertex and parallel to the Z-axis taken as the optical axis, and S is the radial distance of the point measured perpendicular to the Z-axis and wherein the coefficients, $\beta$ through $\epsilon$, normalized to $f_e$ for surface 1, are given on the following table:

|  | 1 |
|---|---|
| C | $+0.1991$ |
| beta | $-8.138 \times 10^{-2}$ |
| gamma | $-3.784 \times 10^{-2}$ |
| delta | $-4.652 \times 10^{-2}$ |
| epsilon | $-1.522 \times 10^{-2}$ | and the same for surfaces 4, 5, and 8 with regard for algebraic sign.

18. The optical system of claim 9 further comprising a series of regularly spaced apart thin receivers mounted on a substrate and each having a width that is at least as large as that of said line images and a spatial frequency substantially the same as that of said lenticular elements of said plates and means for moving said substrate in said image plane to keep said receivers in registration with said line images as the sun changes position during the day.

19. The optical system of claim 9 further including optical means for converging said collimated beams emerging from said second panel into a narrow strip image located a predetermined distance behind said second panel.

20. An optical system comprising:
a first optical panel comprising a pair of thin refracting plates each of which includes a series of regularly spaced cylindrical lentiucules, said plates being arranged in opposed spaced apart relationship so that their cylindrical lenticules optically align as associated pairs, each associated pair of said cylindrical lenticules being optically configured to form a well-corrected line image of a distant point source and having a flat tangential field over the width of the last lenticular element of the pair and over a substantial field angle so that each line image formed by an associated pair of elements always lies in substantially the same plane; and
a second optical panel comprising another pair of thin lenticulated plates each having individual cylindrical elements which are optically registered with one another as associated pairs and which are mounted for movement together in a plane parallel to said image plane of said first optical panel, said second pair of plates being optically structured and arranged for continuously forming from said series of line images formed by said first pair of plates a single well-corrected line image at a predetermined location behind said second panel.

21. The optical system of claim 20 wherein the individual elements of said second pair of plates are substantially identical to those of said first set of lenticular plates and are arranged around a central pair so that the spacing between successive pairs of elements on either side of said central pair changes in a predetermined way such that, when the optical axis of said central pair of elements is aligned with said line images formed by a corresponding central pair on said first set of plates, the elements on said second pair of plates, except for said central pair, cause bundles of rays entering them to emerge from them at preselected angles, corresponding to their successive spacing, so that all emergent ray bundles converge at said preselected focal location behind said second pair of plates.

22. The optical system of claim 21 wherein the refracting surfaces of associated pairs of said lenticular elements of said first and second pair of plates, in the direction of the solar energy traveling through them, are in transverse section of form noncircular, negative, positive and then noncircular.

23. The optical system of claim 22 wherein said positive and negative refracting surfaces are in transverse section circular and each is substantially concentric about the apex of a corresponding one of said noncircular surfaces.

24. The system of claim 20 further structured so that longitudinal displacement of said pairs of plates effects a sharp focusing individually of said emergent ray bundles at said focal location.

25. The optical system of claim 20 further including means for relatively moving said first and second pair of plates to track said line images formed by said first pair of plates in accordance with the diurnal movement of the sun.

26. The optical system of claim 20 wherein the spatial frequencies of said plates lenticular elements are within the range of 2 to 40 per inch.

27. The optical system of claim 20 wherein the width of each of said line images formed by an associated pair of said lenticular elements of said first pairs of plates is approximately one percent of the equivalent focal length of said pair in transverse section and whose length or height is that of said first pair of plates themselves.

28. The optical system of claim 20 wherein the medium of all of said plates has a refractive index of at least 1.5.

29. The optical system of claim 20 wherein an associated pair of lenticular elements of both pairs of said plates of focal length, $f_o$, has constructional data substantially in accordance with the following table:

| EXAMPLE 3 (Refer to FIG. 5) | | | | | |
|---|---|---|---|---|---|
|  |  | Separation | | | |
| Surface | Radius | Medium | Air | $N_s$ | $V_d$ |
| 1 | 5.258* | 1.521 | | | |
|  |  |  |  | 1.8205 | 23.83 |
| 2 | $-1.697*$ |  | .0085 | | |
| 3 | $+1.697*$ | 1.521 | | | |
|  |  |  |  | 1.8205 | 23.83 |
| 4 | $-5.258*$ |  | .0679 | | |
| 5 | 5.258* | 1.521 | | | |
|  |  |  |  | 1.8205 | 23.83 |
| 6 | $-1.697*$ |  | .0085 | | |
| 7 | $+1.697*$ | 1.521 | | | |
|  |  |  |  | 1.8205 | 23.83 |
| 8 | $-5.258*$ |  | infinity | | |

*noncircular in which said surfaces are the surfaces of said elements in numerical order from object to image space, said radii and spacings are normalized to $f_e = 1$, $N_e$ is the index of refraction at 546.1 nm, $V_d$ is the Abbe dispersion number, and wherein said noncircular surfaces have shapes in accordance with the general formula:

$$Z = \frac{CS^2}{1 + \sqrt{1 - C^2S^2(1 - e^2)}} +$$

$$\beta S^4 + \gamma S^6 + \delta S^8 + \epsilon S^{10} + \zeta S^{12}$$

where C is the reciprocal of the surface apex radius, Z represents the distance of a point on the noncircular surface measured from the surface vertex and parallel to the Z-axis taken as the optical axis, and S is the radial distance of the point measured perpendicular to the Z-axis and wherein the coefficients, $C_1$, $\beta$ through $\epsilon$, normalized to $f_e$ for surface 1, are given on the following table:

$C_1 = 1.902$
Beta $= -6.141 \times 10^{-2}$
Gamma $= -6.059 \times 10^{-2}$
Delta $= -3.866 \times 10^{-2}$
Epsilon $= 1.376 \times 10^{-2}$
Zeta $= +2.146 \times 10^{-5}$ and the same for surfaces 4, 5 and 8 with regard to algebraic signs and wherein the coefficients for surface 2 are given in the following table:

$C_2 = 0.5894$
$e_2 = 0.2622$
Beta $= 0.000$
Gamma $= -1.356 \times 10^{-2}$
Delta $= -8.897 \times 10^{-5}$
Epsilon $= +1.950 \times 10^{-4}$
Zeta $= +3.800 \times 10^{-5}$ and the same for surfaces 3, 6 and 7 with regard for algebraic signs.

30. An optical panel for concentrating solar energy throughout most of a day onto a series of regularly spaced apart receivers intended to convert solar energy to another form, said optical panel comprising a pair of thin lenticulated refracting plates, said plates being arranged in opposed spaced apart relationship with respective cylindrical lenticules optically registered with corresponding ones on an opposing plate, said lenticules being structured to form a series of regularly spaced apart line images of the sun, one line image for each associated pair of lenticular elements on said plates, all of said line images moving short distances as a group across a plane behind said panel during the diurnal motion of the sun, the refracting surfaces of associated pairs of said lenticular elements of said plates, in the direction of solar energy traveling through them, being of cross-sectional form, noncircular, negative, positive, and then noncircular.

31. The optical panel of claim 30 wherein said negative and positive refracting surfaces are circular in cross section and each is substantially concentric about the apex of a corresponding one of said noncircular surfaces.

32. An optical panel for concentrating solar energy throughout most of a day onto a series of regularly spaced apart receivers intended to convert solar energy to another form, said optical panel comprising a pair of thin lenticulated refracting plates, said plates being arranged in opposed spaced apart relationship with respective cylindrical lenticules optically registered with corresponding ones on an opposing plate, said lenticules being structured to form a series of regularly spaced apart line images of the sun, one line image for each associated pair of lenticular elements on said plates, all of said line images moving short distances as a group across a plane behind said panel during the diurnal motion of the sun, and wherein an associated pair of said lenticular elements of said plates of focal length, $f_e = 1.0$, have constructional data substantially in accordance with the following table:

| Surface | Radius | Separation Medium | Separation Air | $N_e$ | $V_d$ |
|---|---|---|---|---|---|
| 1 | 3.170* | 1.175 | | | |
| | | | | 1.596 | 30.8 |
| 2 | −1.195 | | .0170 | | |
| 3 | +1.195 | 1.175 | | | |
| | | | | 1.596 | 30.8 |
| 4 | −3.170* | | | | |

*noncircular in which said surfaces are the surfaces of said elements in numerical order from object to image space, said radii and spacings are normalized to $f_e = 1.0$, $N_e$ is the index of refraction at 546.1 nm, $V_d$ is the Abbe dispersion number, and wherein said noncircular surfaces have shapes in accordance with the general formula:

$$Z = \frac{CS^2}{1 + \sqrt{1 - C^2S^2}} + \beta S^4 + \gamma S^6 + \delta S^8 + \epsilon S^{10}$$

where C is the reciprocal of the surface apex radius, Z represents the distance of a point on the noncircular surface measured from the surface vertex and parallel to the Z-axis taken as the optical axis, and S is the radial distance of the point measured perpendicular to the Z-axis and wherein the coefficients, $\beta$ through $\epsilon$, normalized to $f_e$, are given in the following table:

| | Surface | |
|---|---|---|
| | 1 | 4 |
| C | 0.3155 | −0.3155 |
| beta | −2.003 × 10$^{-1}$ | +2.003 × 10$^{-1}$ |
| gamma | +2.517 × 10$^{-3}$ | −2.517 × 10$^{-3}$ |
| delta | −3.971 × 10$^{-1}$ | +3.971 × 10$^{-1}$ |
| epsilon | −6.703 × 10$^{-2}$ | +6.703 × 10$^{-2}$ |

33. An optical system for concentrating solar radiation on a narrow strip image at a fixed location during the diurnal motion of the sun, said optical system comprising:

(a) a first pair of thin lenticulated plates arranged in opposed spaced apart relationship with respective cylindrical lenticules optically registered with corresponding ones on an oppositely facing plate, said lenticules being structured to form a series of regularly spaced apart line images of the sun, one line image for each associated pair of lenticular elements on said plates, all of said line images moving in a plane behind said plates as a group a distance substantially equal to the width of one of said lenticules during a preselected interval during the diurnal motion of the sun; and (b) a second pair of lenticulated plates having individual cylindrical elements which are optically registered with one another as associated pairs and which are mounted for movement together in a plane parallel to said image plane of said first pair of plates, said second pair of plates being optically structured and arranged for continuously forming from said series of strip images formed by said first pair of plates a single strip image of the sun at a predetermined location behind said second plates during the sun's diurnal motion, said individual elements of said second pair of plates being substantially identical to those of said first set of lenticular plates and arranged around a central pair so that the spacing between successive pairs of elements on either side of said central pair changes in a predetermined way such that, when the optical axis of said central pair of elements is aligned with said strip images formed by a corresponding central pair on said first set of plates, the elements on said second pair of plates, except for said central pair, cause bundles of rays entering them to emerge from them at preselected angles, corresponding to their successive spacing, so that all emergent ray bundles converge at said preselected focal location behind said second pair of plates.

34. The optical system of claim 33 wherein the refracting surfaces of associated pairs of said lenticular elements of said first and second pair of plates, in the direction of the solar energy traveling through them, are in transverse section of form noncircular, negative, positive and then noncircular.

35. The optical system of claim 34 wherein said positive and negative refracting surfaces are in transverse section circular and each is substantially concentric about the apex of a corresponding one of said noncircular surfaces.

36. An optical system for concentrating solar radiation as a narrow strip image at a fixed location during the diurnal motion of the sun, said optical system comprising:

(a) a first pair of thin lenticulated plates arranged in opposed spaced apart relationship with respective cylindrical lenticules optically registered with corresponding ones on an oppositely facing plate, said lenticules being structured to form a series of regularly spaced apart line images of the sun, one line image for each associated pair of lenticular elements on said plates, all of said line images moving in a plane behind said plates as a group a distance substantially equal to the width of one of said lenticules during a preselected interval during the diurnal motion of the sun; and (b) a second pair of lenticulated plates having individual cylindrical elements which are optically registered with one another as associated pairs and which are mounted for movement together in a plane parallel to said image plane of said first pair of plates, said second pair of plates being optically structured and arranged for continuously forming from said series of strip images formed by said pairs of plates a single strip image of the sun at a predetermined location behind said second plates during the sun's diurnal motion, said lenticular elements of both pairs of said plates of focal length, $f_s$, having constructional data substantially in accordance with the following table:

| Surface | Radius | Separation Medium | Air | $N_s$ | $V_d$ |
|---|---|---|---|---|---|
| 1 | 5.258* | 1.521 | | | |
| | | | | 1.8205 | 23.83 |
| 2 | −1.697* | | .0085 | | |
| 3 | +1.697* | 1.521 | | | |
| | | | | 1.8205 | 23.83 |
| 4 | −5.258* | | .0679 | | |
| 5 | 5.258* | 1.521 | | | |
| | | | | 1.8205 | 23.83 |
| 6 | −1.697* | | .0085 | | |
| 7 | +1.697* | 1.521 | | | |
| | | | | 1.8205 | 23.83 |
| 8 | −5.258* | | infinity | | |

*noncircular in which said surfaces are the surfaces of said elements in numerical order from object to image space, said radii and spacings are normalized to $f_s=1$, $N_s$ is the index of refraction at 852.1 nm, $V_d$ is the Abbe dispersion number, and wherein said noncircular surfaces have shapes in accordance with the general formula:

$$Z = \frac{CS^2}{1 + \sqrt{1 - C^2S^2(1 - e^2)}} + \beta S^4 + \gamma S^6 + \delta S^8 + \epsilon S^{10} + \zeta S^{12}$$

where C is the reciprocal of the surface apex radius, Z represents the distance of a point on the noncircular surface measured from the surface vertex and parallel to the Z-axis taken as the optical axis, and S is the radial distance of the point measured perpendicular to the Z-axis and wherein the coefficients, $C_1$, $\beta$ through $\zeta$, normalized to $f_s$ for surface 1, are given on the following table:

$C_1 = 1.902$
Beta $= -6.141 \times 10^{-2}$
Gamma $= -6.059 \times 10^{-2}$
Delta $= -3.866 \times 10^{-2}$
Epsilon $= -1.376 \times 10^{-2}$
Zeta $= +2.146 \times 10^{-5}$ and the same for surfaces 4, 5 and 8 with regard to algebraic signs and wherein the coefficients for surface 2 are given in the following table:

$C_2 = -0.5894$
$e_2^2 = 0.2622$
Beta $= 0.000$
Gamma $= -1.356 \times 10^{-2}$
Delta $= -8.897 \times 10^{-5}$
Epsilon $= +1.950 \times 10^{-4}$
Zeta $= +3.800 \times 10^{-5}$ and the same for surfaces 3, 6 and 7 with regard for algebraic signs.

37. An optical system comprising:
a first optical panel comprising a pair of thin refracting plates each of which includes a series of regularly spaced cylindrical lenticules, said plates being arranged in opposed spaced apart relationship so that their cylindrical lenticules optically align as associated pairs, each associated pair of said cylindrical lenticules being optically configured to form a well-corrected line image of a distant point source and having a flat tangential field over the width of the last lenticular element of the pair and over a substantial field angle so that each line image formed by an associated pair of elements always lies in substantially the same plane; and
a second optical panel substantially identical in structure to said first optical panel and mounted for movement in a plane parallel to said image plane of said first optical panel, said second optical panel, when the optical axes of its lenticular elements are respectively aligned with said line images formed by said first optical panel and such that said images formed by said first pair of plates serve as the objects for said second panel, operating to cause effectively the opposite refractions caused by said first panel whereby, as a point source and consequently said line images move, said second panel can be moved so that the radiation entering said first pair of plates can be made to continuously emerge from said second pair of plates as a series of regularly spaced apart narrow collimated beams of radiation.

* * * * *